United States Patent
Lam et al.

(10) Patent No.: US 7,639,954 B2
(45) Date of Patent: Dec. 29, 2009

(54) DRIVER FOR AN OPTICAL TRANSMITTER

(75) Inventors: Kut Hing Lam, Hong Kong (CN); Yu Wing Choi, Hong Kong (CN); Torsten Wipiejewski, Hong Kong (CN)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 432 days.

(21) Appl. No.: 11/246,116

(22) Filed: Oct. 11, 2005

(65) Prior Publication Data

US 2007/0081567 A1   Apr. 12, 2007

(51) Int. Cl.
*H04B 10/04* (2006.01)

(52) U.S. Cl. .................. 398/198; 398/183; 398/197

(58) Field of Classification Search ........... 398/182, 398/192, 194, 197, 198, 195, 196, 183
See application file for complete search history.

(56) References Cited

U.S. PATENT DOCUMENTS

| 5,107,362 | A * | 4/1992 | Motoshima et al. ......... 398/197 |
|---|---|---|---|
| 6,362,910 | B1 | 3/2002 | Tokita |
| 2004/0028099 | A1* | 2/2004 | Hongo et al. ............ 372/38.02 |
| 2006/0197452 | A1* | 9/2006 | Zhang ..................... 315/32 |

FOREIGN PATENT DOCUMENTS

| CN | 1246002 | | 3/2000 |
|---|---|---|---|
| GB | 2162399 | A * | 1/1986 |
| JP | 63-229881 | | 9/1988 |
| JP | 10-209538 | | 8/1998 |
| JP | 2000-299498 | | 10/2000 |
| JP | 2001-156719 | | 6/2001 |

OTHER PUBLICATIONS

Harry Dutton, "Understanding Optical Communications", IBM International Technical Support Organization, Sep. 1998.*
International Search Report mailed by the International Bureau on Feb. 1, 2007 in corresponding PCT/CN2006/002508.

* cited by examiner

*Primary Examiner*—Christina Y Leung
(74) *Attorney, Agent, or Firm*—Buchanan Ingersoll & Rooney PC

(57) ABSTRACT

A modulation driver for delivering an output modulation current for driving an optical source of an optical transmitter, the output modulation current comprises a first modulation current region characterised with a first temperature gradient and a second modulation current region characterised with a second temperature gradient, said first modulation current region and said second modulation region being for delivering modulation current at a first temperature range and a second temperature range, temperatures of said second temperature being higher than temperatures of said first temperature range, said second temperature gradient being larger than said first temperature gradient.

9 Claims, 6 Drawing Sheets

DRIVER FOR AN OPTICAL TRANSMITTER

FIELD OF THE INVENTION

This invention relates to optical signal generation and, more particularly, to a modulation driver for an optical source of an optical transmitter. More specifically, although not exclusively, this invention relates to a modulation driver for a laser source for use in optical communication.

BACKGROUND OF THE INVENTION

Fibre optic transmitters and transceivers are widely used in data-communication and telecommunications applications. In a typical optical signal transmitter, a light source, for example, a laser source, is biased at an average optical power point with a constant bias current. To encode data for transmission, the bias current is usually modulated around this bias point. For most optical communication applications, a binary modulation corresponding to a logic high "1" or logic low "0" is commonly used. Typically, signal information is transmitted by stream of pulses comprising "On" and "Off" pulses or "Hi" or "Lo" pulses. For example, an "On" pulse is sent with a higher modulation current and an "Off" pulse is sent with a lower modulation current or vice versa. For good transmission performance, the output optical power of the "Off" pulse should be as low as possible and it is ideal if there is no optical output when an "Off" pulse is being transmitted to obtain a good "eye-diagram" with a wide "eye-opening". To attain this purpose, the laser current should be as low as possible when an "Off" pulse is sent. On the other hand, because the laser driving current must stay above the threshold current in order to attain a good dynamic response, the lowest laser current corresponding to an "Off" pulse should be as near the threshold current as possible, whereby a balance between a good dynamic response for high speed operation and a good extinction ratio can be struck. The extinction ratio is a ratio between the high and low level signal of an optical output power and a good extinction ratio is typically represented by an eye-diagram with a wide opening. Thus, control of laser current is critical for good performance of an optical transmission system.

Vertical-cavity surface-emitting lasers (VCSELs) are extensively used in fibre optic communications, especially for data-communication applications. A typical optical output power versus current characteristics of an exemplary light source comprising a VCSEL is shown in FIG. 1. For a typical laser source, the threshold current and differential quantum efficiency change with temperature, although the specific change of threshold current depends on the device designed. Generally speaking, the threshold current of a laser source has a minimum at around room temperature, the threshold current increases with higher and lower operating temperatures. The quantum efficiency normally decreases with increasing temperature.

Modulation of an optical source is typically by a modulation driver. MAX 3930, MAX 3701, MAX 3735A and MAX 3740A from Maxim are exemplary modulation drivers for providing modulation current to a laser source for signal transmissions. However, conventional modulation drivers are not satisfactory for operation above room temperatures, for example, above 70° C. and are not satisfactory for operation within a wide temperature range, for example, from room temperature to 125° C.

OBJECT OF THE INVENTION

Accordingly, it is an object of this invention to provide modulation driver for an optical source which alleviates shortcomings of conventional modulation drivers. At a minimum, it is an object of this invention to provide the public with a useful choice of a novel modulation driver for an optical source.

SUMMARY OF THE INVENTION

Broadly speaking, the present invention has described a modulation driver for delivering an output modulation current for driving an optical source of an optical transmitter, the output modulation current comprises a plurality of modulation current regions each of which has a characteristic temperature gradient for a specific non-over-lapping temperature range.

According to a preferred embodiment of this invention, there is provided a modulation driver for delivering an output modulation current for driving an optical source of an optical transmitter, the output modulation current comprises a first modulation current region characterised with a first temperature gradient and a second modulation current region characterised with a second temperature gradient, said first modulation current region and said second modulation region being for delivering modulation current at a first temperature range and a second temperature range, temperatures of said second temperature being higher than temperatures of said first temperature range, said second temperature gradient being larger than said first temperature gradient.

According to another embodiment of this invention, there is provided an optical transmitter comprising a laser source and a modulation driver according to claim 1, the optical transmitter further comprises a photo-detector to monitor output of the laser source and to provide feedback control to the modulation driver to control optical output from said laser source.

Preferably, said modulation driver comprises a first modulation current source which is characterised with a first temperature gradient and a second modulation current source which is characterised with a second temperature gradient, the output modulation current of said modulation driver is delivered by said first modulation current source in said first temperature range and modulation current is delivered by said second current source in said second temperature range, said first and said second temperature ranges together form a continuous temperature range.

Preferably, said device further comprising a current switch, the current switch operates to deliver modulation current of a modulation current source which as a higher current output as the output modulation current of said modulation driver.

Preferably, said current switch comprises a diode which is forward conductive when the magnitude of modulation current of said second modulation current source exceeds that of said first modulation current source, whereby placing said second modulation current source as the output modulation current source of said modulation driver in said second temperature region.

Preferably, said device further comprising a discriminator, the current discriminator selects a modulation current source with a higher current magnitude as the output modulation current source.

Preferably, said current discriminator operates to switch between said first modulation current source and said second modulation current source when the magnitude of modulation current of said second modulation current source overtakes that of said first modulation current source and when the magnitude of modulation current of said second modulation current drops below that of said first modulation current source.

Preferably, each one of said first and said second modulation current sources comprises means for adjusting temperature gradients.

Preferably, magnitude of modulation current of said second modulation current source exceeds that of said first modulation current source in said second temperature range and magnitude of modulation current of said second modulation current source is below that of said first modulation current source in said first temperature range.

Preferably, said modulation driver comprises a first modulation current source, a second modulation current source and a modulation current output for outputting modulating current for driving an optical source of an optical transmitter, said first and said second modulation current sources are respectively characterised by a first temperature coefficient and a second temperature coefficient, said second temperature coefficient being higher than said first temperature coefficient, modulation current at said modulation current output at a temperature being from a modulation current source with a higher current output at that temperature.

Preferably, output modulation current at said modulation current output being from said first modulation current source and said second modulation current source respectively at a first temperature range and a second temperature range, temperatures of said second temperature range being higher than temperatures of said first temperature range.

Preferably, output modulation current of said driver comprise first and second linear regions, each of said first and second linear regions being characterised with a temperature gradient, the temperature gradients are respectively characterised by a first temperature coefficient and a second temperature coefficient, said second temperature gradient being higher than said first gradient, and said second linear region being the output modulation current of the modulation driver above a temperature when the magnitude of said second linear region exceeds that of said first modulation current source output.

Preferably, the temperature gradient of a current region for a higher temperature range is higher than that of a lower temperature range.

Preferably, each modulation current region is due to an individual current source, a current source with a higher magnitude takes over a current source with a lower magnitude as an output current source.

BRIEF DESCRIPTION OF THE DRAWINGS

Preferred embodiments of the present invention will be explained in further detail below by way of examples and with reference to the accompanying drawings, in which:—

DETAILED DESCRIPTION OF THE PREFERRED EMBODIMENTS

An optical transmitter is a key component in an optical communication system. A typical optical transmitter comprises a light source, for example, a LED source or a laser source. The optical output of a light source is usually modulated for transmission of encoded digital signals.

Performance of conventional fibre optic communication systems degrades very rapidly when the operation ambient temperature is above room temperature, for example, above 50° C. This is unacceptable as fibre optic systems are frequently required to be deployed under harsh conditions, for example, in deserts and in automotive applications, which require stable system performance between a wide temperature range, for example, 0° C.-125° C.

Figure 1:
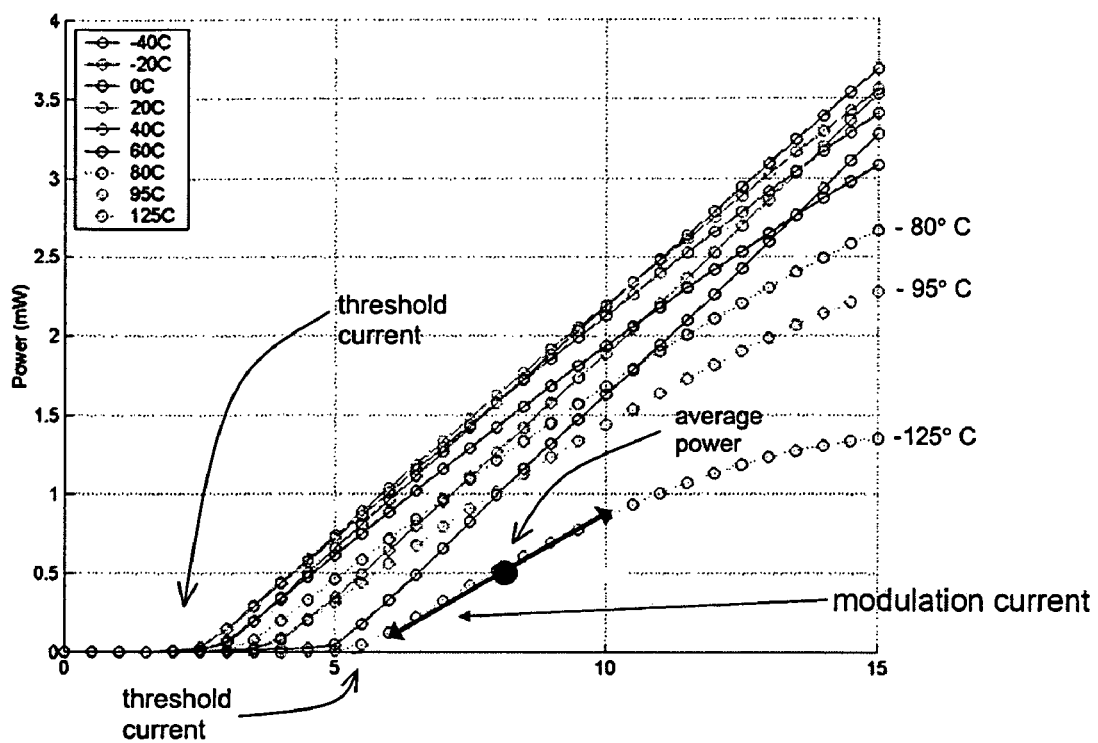
FIG. 1 shows a typical optical curve of output power versus current characteristics of an exemplary light source (VCSEL)
Figure 2:
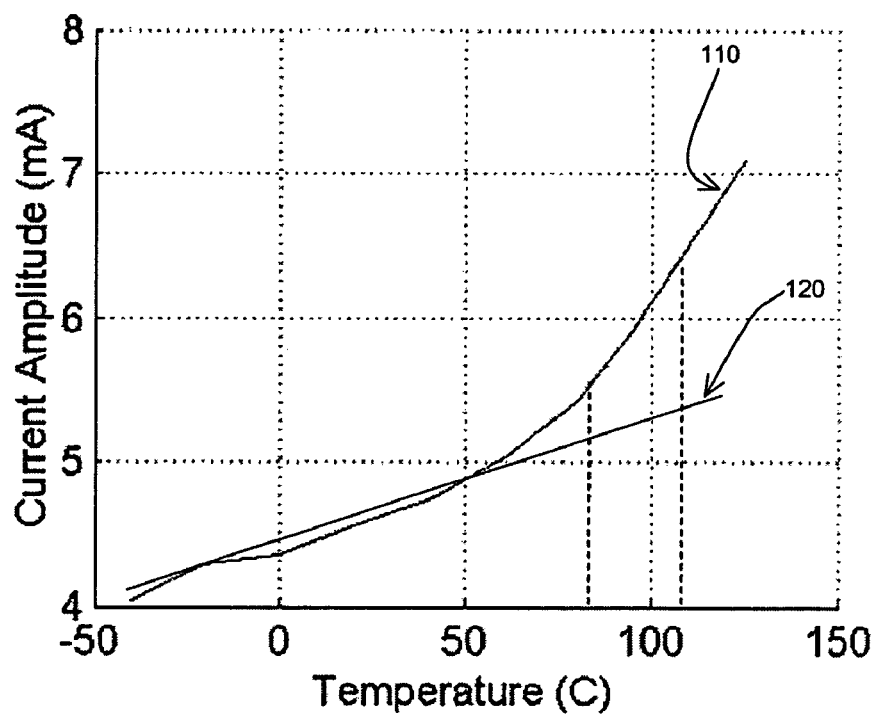
FIG. 2 shows a modulation current versus temperature curve for the exemplary laser source of FIG. 1 for attaining a constant average output power and extinction ratios.

It is noted that the performance characteristics of conventional modulation drivers at elevated temperatures at least contributes to the performance degradation of optical systems. The curve (110) in FIG. 2 shows a variation of amplitude of modulation current against temperature for an exemplary laser source which is required to obtain a constant average output power and extinction ratio. The modulation current amplitude shown on the Y-axis is the total current above the laser source threshold current. As can be seen from the curve (110), the required modulation current increases with ambient temperature and the gradient becomes significantly steeper above 50° C. On the other hand, the graph (120) shows an exemplary output modulation current of a conventional modulation driver which has a constant temperature gradient for the entire temperature range. Consequently, the modulation current requirements of the laser driver for a good system performance as shown by curve (110) could not be met by conventional drivers at the elevated temperatures.

Figure 3:
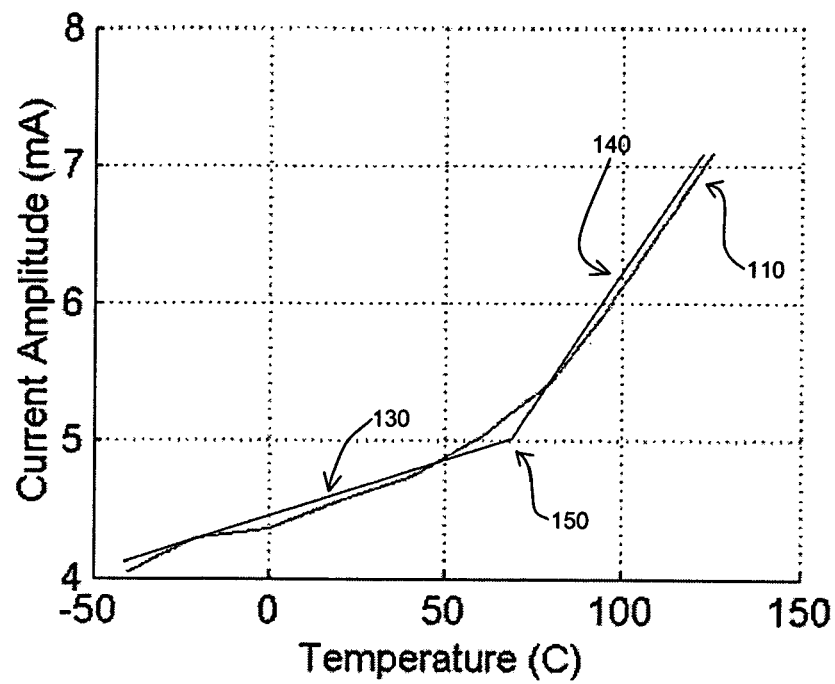
FIG. 3 shows exemplary modulation current characteristics of a modulation driver of this invention alongside the characteristic modulation current curve of a laser source of FIG. 1.

To alleviate shortcomings of conventional modulation drivers, this invention provides a modulation driver which is configured to generate output modulation current with output characteristics more closely resembling the target modulation current curve (110). In the example of FIG. 3, the output modulation current of a modulation driver of this invention comprises two linear modulation current regions which extends over the temperature range of −50° C. to +125° C. The first modulation current region (130) is characterised with a first temperature gradient and the second modulation current region (140) is characterised with a second temperature gradient. The first modulation current region terminates at a change-over temperature, which is at about 70° C. in this example. The second modulation current region begins at where the first modulation current region ends. The second modulation current region has a larger temperature gradient so that the modulation current temperature characteristics follow more closely the steeper region of the curve of the target modulation current above 70° C. Of course, the transition or change-over temperature, at which the output modulation current is switched over from one modulation current region to another modulation current region, is application specific and depends on the characteristics of individual laser sources. By providing two piece-wise linear modulation current regions, a modulation driver can generate output modulation current more closely resembling the modulation current requirements of a real optical source for attaining both good extinction ratio and good dynamic response throughout the entire operation temperature range. Although two piece-wise linear modulation current regions are used in the example of FIG. 3, more than two linear regions can be combined to form the output modulation current region of the modulation current driver for the entire operating temperature region, as shown in the schematic diagram of FIG. 5.

Figure 4:
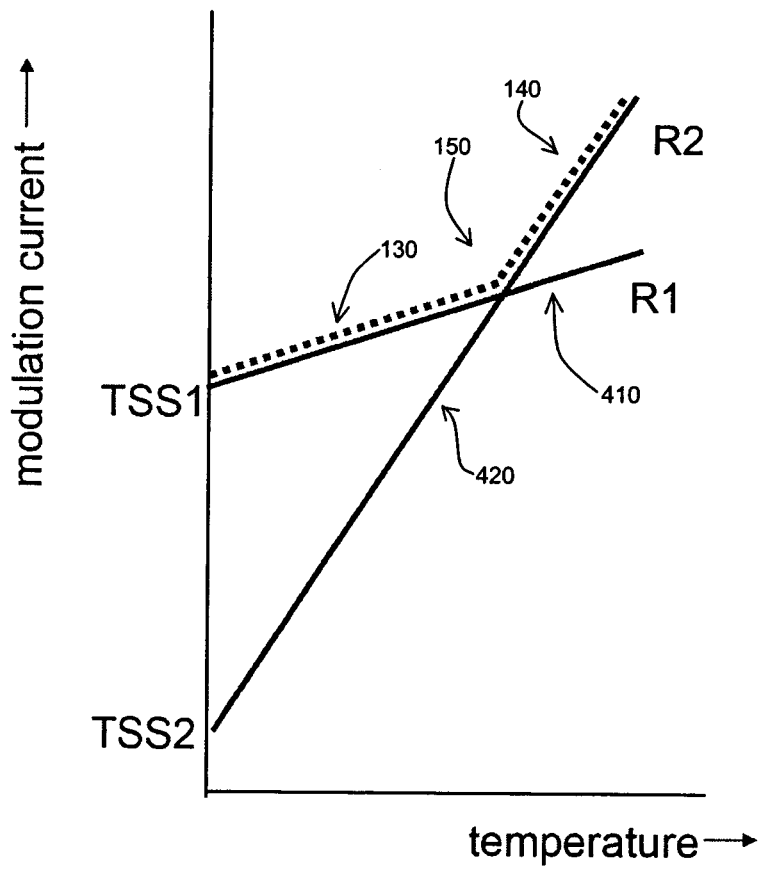
FIG. 4 shows current characteristics of the component modulation current sources of FIG. 3 and the resulting output modulation current (150) of a modulation driver of this invention.

FIG. 4 illustrates exemplary formation of two modulation current regions (130, 140) to form the output modulation current region (150) from a first modulation current source (410) and a second modulation current source (420). The output of the second modulation current source will overtake the output of the first modulation current source as the output modulation current source when the magnitude of the output current of the second source exceeds that of the first modulation current source. Likewise, the output of the first modulation current source will overtake the output of the second modulation current source as the output modulation current source when the magnitude of the output current of the first source exceeds that of the first modulation current source. This occurs on a downward temperature shift.

Figure 5:
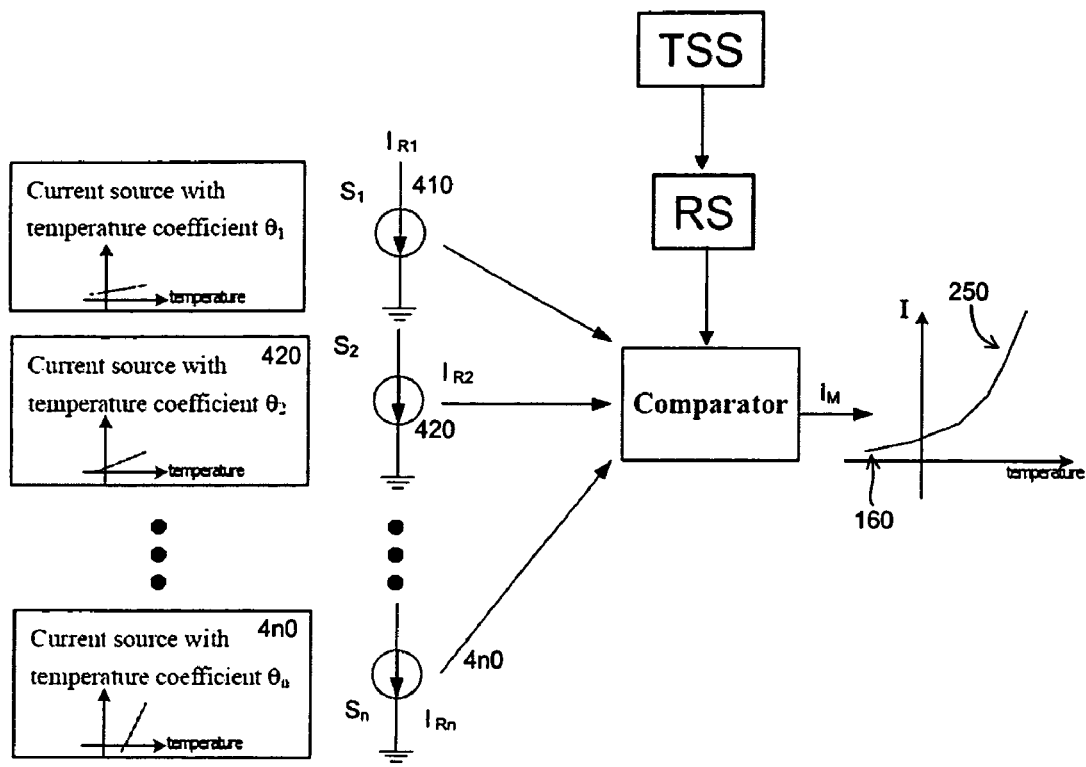
FIG. 5 is a schematic diagram illustrating building blocks of a modulation driver of this invention.

FIG. 5 is a schematic diagram showing an output modulation current region (250) which is built from a plurality of linear modulation current regions. Each modulation current region is composed of a modulation current from a particular modulation current regions source and the output modulation current (250) is composed of piece-wise assembly of modulation current regions from the respective modulation current sources, namely, 410, 420, . . . , 4N0. The modulation current sources are respectively with temperature coefficients $\theta_1$, $\theta_2$, . . . $\theta_N$. More particularly, the current source (410) which is responsible for the lowest temperature region has the lowest temperature gradient and the lowest temperature axis intercept (X). The second current source (420) has a higher temperature coefficient and a higher temperature axis intercept compared to the first current source so that the second modulation current region can intercept the first current region at a first change-over temperature T1 and take over the first current region as the output modulation source when ambient temperature increases. Likewise, a current source responsible for the higher temperatures has a higher temperature gradient and a higher temperature axis intercept so that it can take over the current sources for the lower temperatures as the output modulation current source for the temperature range for which they are designed for when ambient temperature increases. On the other hand, a current source responsible for lower temperatures will take over a current source for higher temperatures when modulation current output of the higher temperature current output drops below that of the lower temperature current source on an downward temperature shift. Taking over occurs when the magnitude of current output of the taking over current source exceeds that of the superseded current source.

Figure 6:
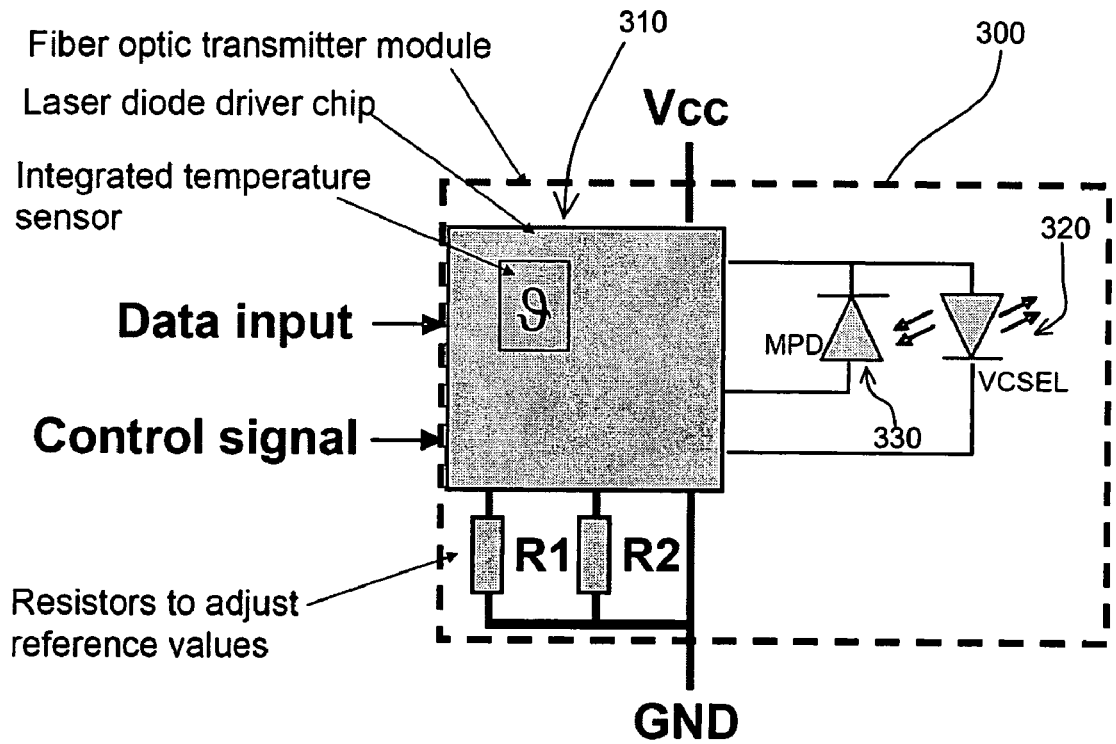
FIG. 6 is a block diagram showing an optical transmitter which comprises an exemplary modulation driver of a first preferred embodiment of this invention.

FIG. 6 illustrates an optical transmitter (300) incorporating a modulation driver IC (integrated circuit) (310) of a first preferred embodiment of this invention. The output modulation current of this modulation driver resembles the output characteristics of the curve (150) of FIG. 3 and comprises two linear modulation current regions (130, 140), although the current amplitude and the change-over temperature (or the turning-point temperature) need not be the same.

The optical transmitter (300) comprises a VCSEL laser source and a monitor photo-diode (MPD) (330). The MPD is provided for monitoring the output of the laser source and to provide feedback control signal for closed lop control. The modulation driver comprises a first modulation current source (510) $S_1$ and a second modulation current source (520) S2. The average laser current which flows through the VCSEL laser source can be adjusted to preset values respectively by resistor R1, R2 which are connected to the modulation driver IC. Of course, resistance values can be selected by wire-bonding of on-chip resistors as is commonly known in IC technologies. An integrated temperature sensor is formed on the IC driver chip to provide temperature information to the driver circuitry.

The modulation driver comprises a temperature select switch circuit (TSS) which generates temperature reference points to define the required modulation current. Signal output from the TSS is used to operate the range select switch (RS) to determine the correct modulation current for a prescribed operating temperature range. The actual value of the modulation current can be adjusted by comparing it with a reference value. The reference value can be implemented by means of external resistors (for example, R1, R2) or, otherwise, on-chip resistors.

Figure 7:
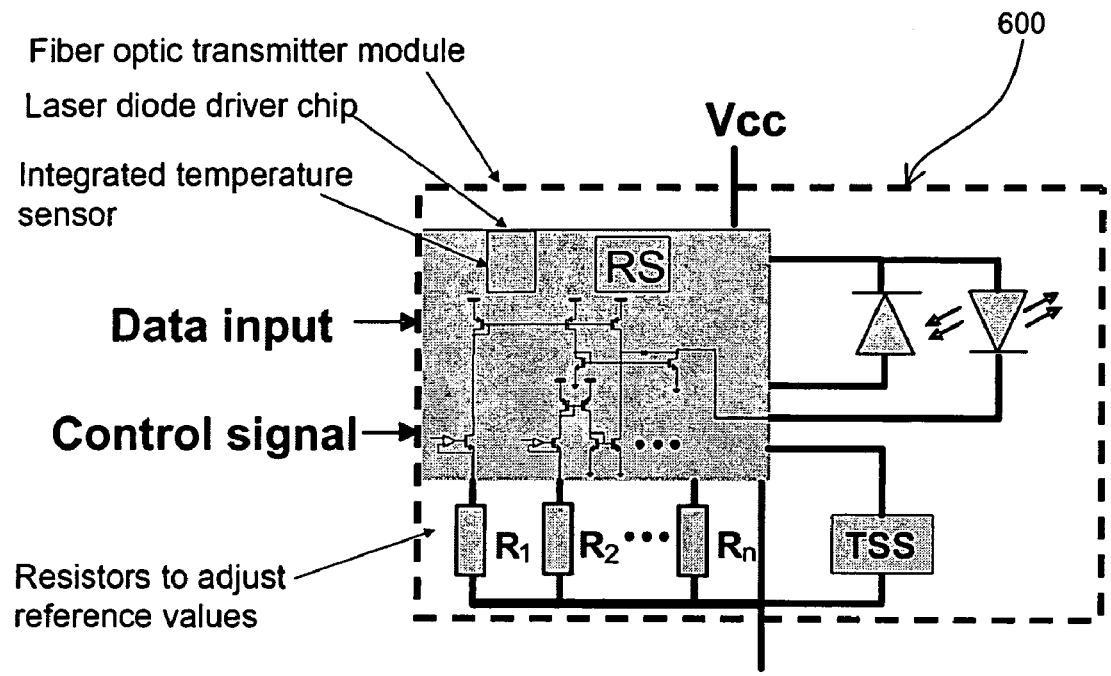
FIG. 7 shows a schematic diagram of a second preferred embodiment of a modulation driver of this invention.

FIG. 7 illustrates a second preferred embodiment of this invention in which a plurality of modulation current sources are utilized to implement the multiple-segment output modulation current curve (200) of FIG. 5. Each of the component modulation current sources $S_1$-$S_N$ is respectively provided with a resistor (R1, R2 . . . RN) for adjusting the reference value of the modulation current.

Figure 8:
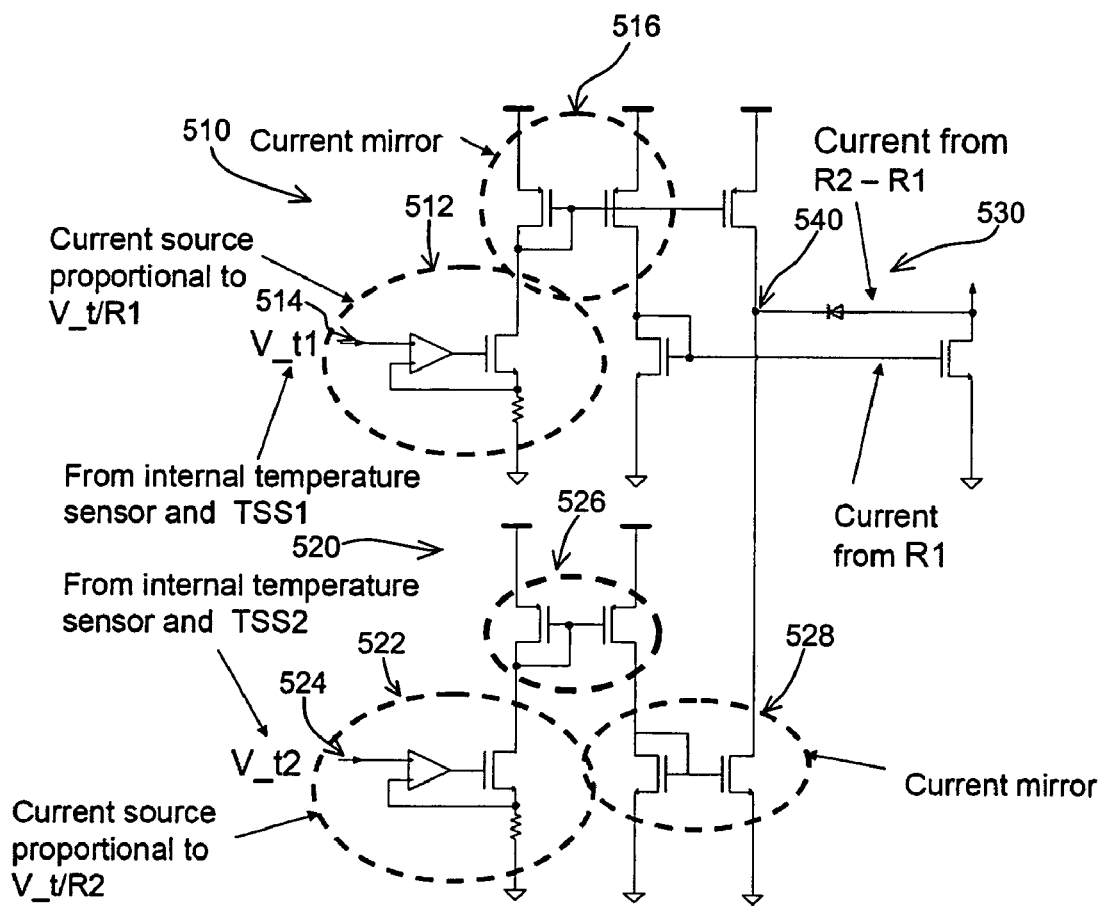
FIG. 8 is a schematic diagram showing modulation current sources of the modulation driver of FIG. 6 in more detail.

FIG. 8 shows an exemplary circuitry for implementing the current source of a modulation driver with an output characteristic of FIG. 3. The modulation driver comprises a first current source (510) and a second current source (520). The first current source comprises an input voltage proportional current source (512) which is connected to a current mirror (516). The input of the input voltage dependent current source (512) is connected to the output of an internal temperature sensor which generates temperature dependent output voltages with a temperature coefficient or temperature gradient consistent with that of the first modulation current source. The reference current value is adjusted by resistor R1. The second modulation current source (520) comprises an input voltage current source (522) with a voltage input (524). The current output of this input voltage proportional current source is output to a first current mirror (526) and then a second current mirror (528). The current mirrors amplify currents from their respective sources. The second current mirror (528) serves to invert the current direction from R2 so that $I_{R2}$ will be subtracted from $I_{R1}$ in this arrangement.

Figure 9:
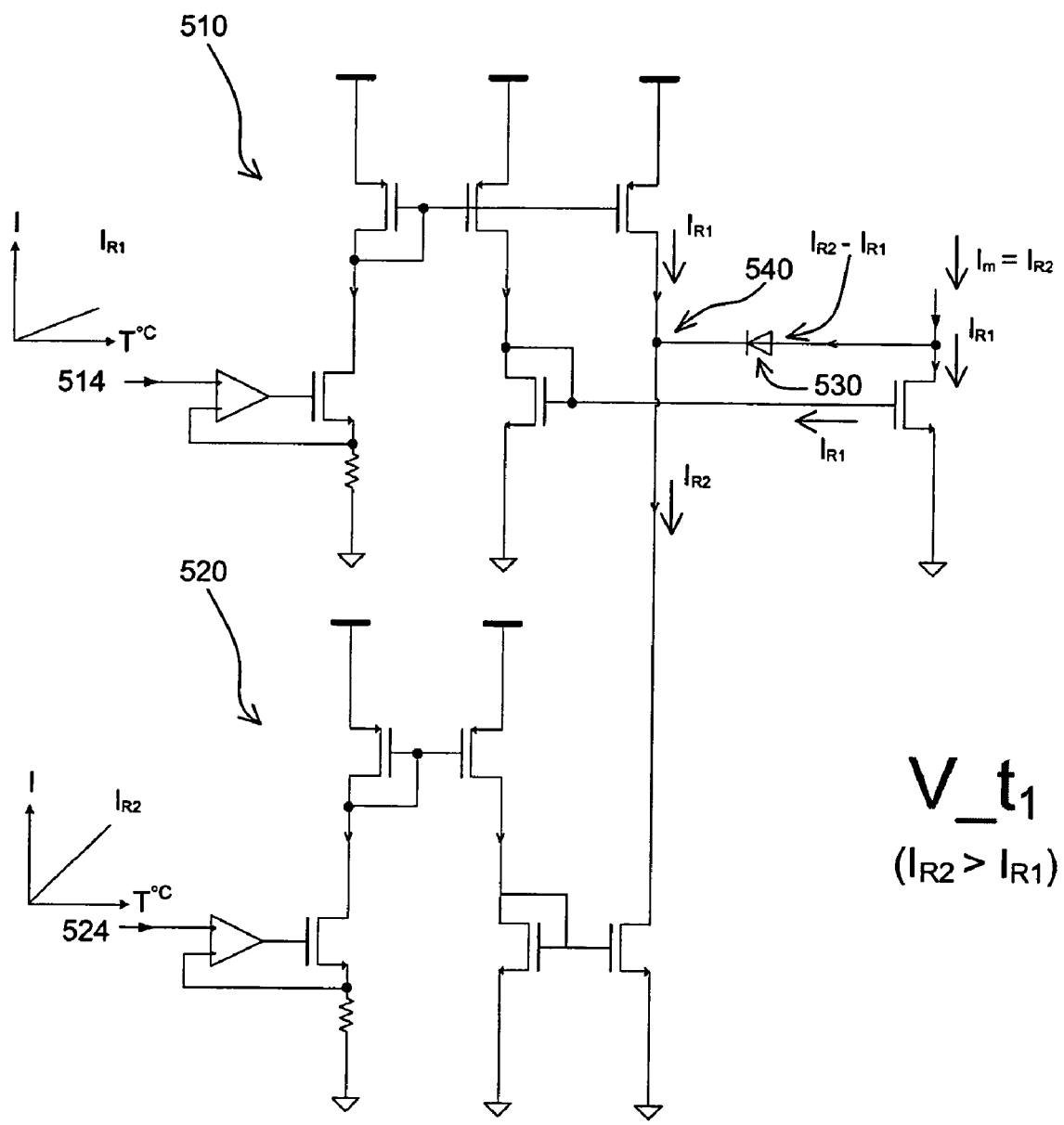
FIG. 9 is a schematic circuit diagram showing the operation of the modulation driver in a second temperature range.
Figure 10:
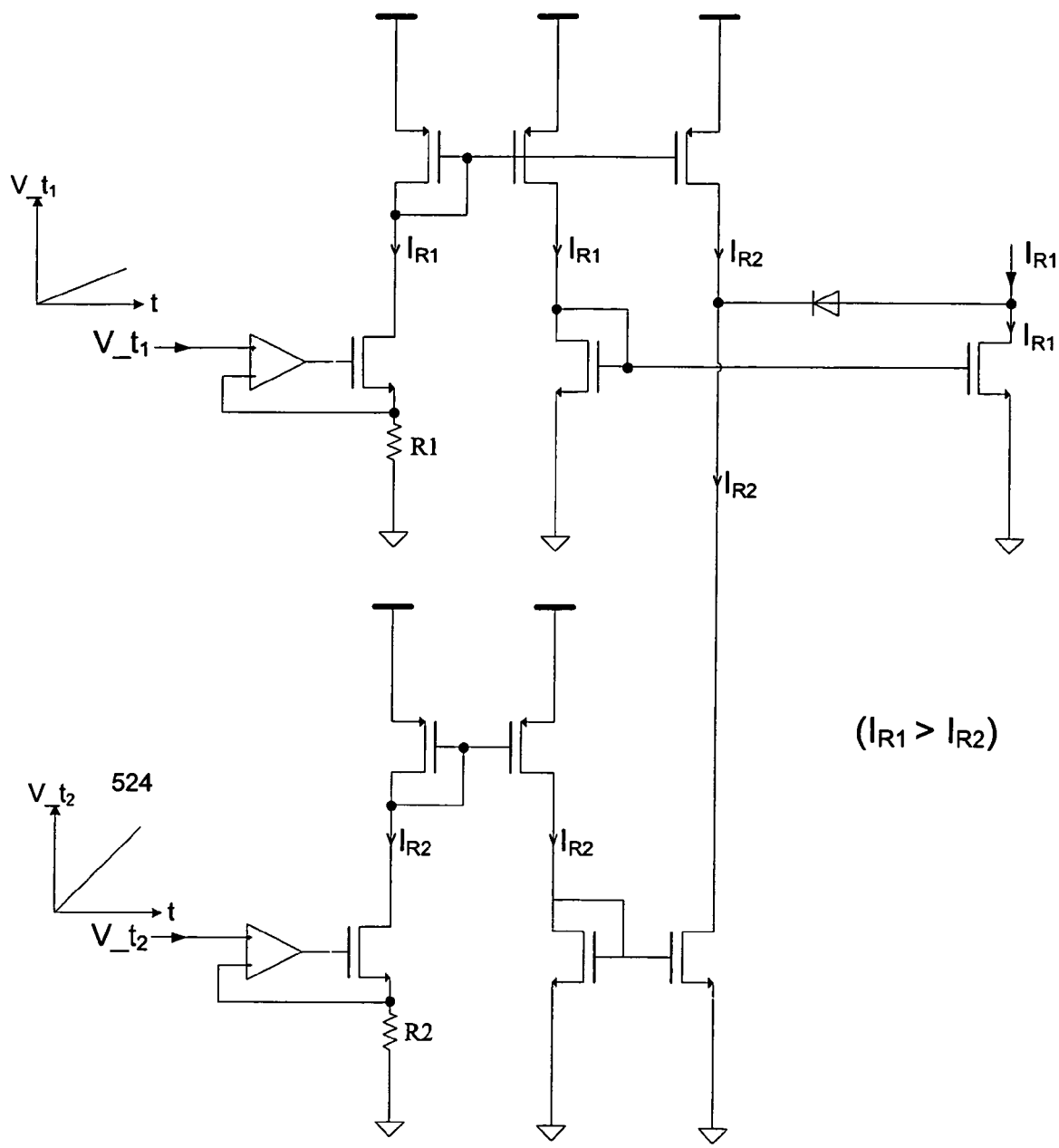
FIG. 10 is a schematic circuit diagram showing the operation of the modulation driver in a first temperature range.

The output of the first modulation current source (510) and the second modulation current source (520) is connected to a discriminator which outputs a current with a higher magnitude. The discriminator (530) is exemplified by a diode in the circuit of FIG. 8. Operation of the current source circuitry of FIG. 8 will be described below with reference to FIGS. 9 and 10. In FIG. 9, the magnitude of current output from the second current source exceeds that of the first current source. At node (540), current from the first modulation current source ($I_{R1}$) and current from the second modulation current source ($I_{R2}$) meet. As the summation of current and node (540) must be zero, the current flowing through the diode (530) would $I_{R2}$-$I_{R1}$. Consequently, the output modulation current ($I_M$) equals to $I_{R2}$ as shown in FIG. 9. On the other hand, when the magnitude of the current output ($I_{R1}$) from the first current source (510) exceeds the output current ($I_{R2}$) of the second current source (520), there will be no conduction through the diode (530) and the output modulation current output of the modulation driver $I_M$ would be equal to $I_{R1}$. Hence, by selecting current sources with appropriate temperature gradient and intercept at the modulation current axis (TSS1, TSS2), a modulation current driver conforming to the output characteristics of FIGS. 3 and 5 would be obtained. Of course, the current source circuitry illustrated in FIGS. 8-10 are merely for illustration only and other appropriate current source circuitry available to persons skilled in the art from time to time could be used without loss of generality.

While the present invention has been explained by reference to the examples or preferred embodiments described above, it will be appreciated that those are examples to assist understanding of the present invention and are not meant to be restrictive. Variations or modifications which are obvious or trivial to persons skilled in the art, as well as improvements made thereon, should be considered as equivalents of this invention. In particular, although only two current sources have been described in the exemplary driver alone, it will be appreciated that a driver can comprise a plurality of current sources so that the effective operating regions of the driver are partitioned by the plurality of current sources mutatis mutandis. In addition, although current sources are described above, it will be appreciated by persons skilled in the art that the same principles apply to voltage sources.

Furthermore, while the present invention has been explained by reference to a laser source, it should be appreciated that the invention can apply, whether with or without modification, to other optical sources, including LED sources, which exhibit a non-liner modulation current vs. temperature characteristic without loss of generality.

The invention claimed is:

1. A modulation driver for delivering an output modulation current for driving an optical source of an optical transmitter, the output modulation current of said driver having first and second discrete linear modulation current regions, the first discrete linear modulation current region having a first temperature gradient and the second discrete linear modulation current region having a second temperature gradient, said second temperature gradient being larger than said first temperature gradient, said modulation driver comprising: a first modulation current source which is associated with the first temperature gradient and a second modulation current source which is associated with the second temperature gradient, the output modulation current of said modulation driver being delivered by said first modulation current source in a first temperature range and modulation current being delivered by said second current source in a second temperature range, said first and said second temperature ranges together forming a continuous temperature range, and wherein temperatures of said second temperature range are higher than temperatures of said first temperature range.

2. A modulation driver according to claim 1, further comprising a current switch, wherein the current switch operates to deliver modulation current of a modulation current source having a higher current output as the output modulation current of said modulation driver.

3. A modulation driver according to claim 2, wherein said current switch comprises a diode which is forward conductive when the magnitude of modulation current of said second modulation current source exceeds that of said first modulation current source, thereby placing said second modulation current source as the output modulation current source of said modulation driver in said second temperature region.

4. A modulation driver according to claim 1, further comprising a current discriminator, wherein the current discriminator selects a modulation current source with a higher current magnitude as the output modulation current source.

5. A modulation driver of claim 4, wherein said current discriminator operates to switch between said first modulation current source and said second modulation current source when the magnitude of modulation current of said second modulation current source overtakes that of said first modulation current source and when the magnitude of modulation current of said second modulation current drops below that of said first modulation current source.

6. A modulation driver of claim 1, wherein each one of said first and said second modulation current sources comprises means for adjusting temperature gradients.

7. A modulation driver according to claim 1, wherein the magnitude of modulation current of said second modulation current source exceeds that of said first modulation current source in said second temperature range and the magnitude of modulation current of said second modulation current source is below that of said first modulation current source in said first temperature range.

8. A modulation driver according to claim 1, wherein said modulation driver comprises modulation current output for outputting modulating current for driving an optical source of an optical transmitter, said first and said second modulation current sources are respectively associated with a first temperature coefficient and a second temperature coefficient, said second temperature coefficient being higher than said first temperature coefficient, wherein the modulation current at said modulation current output at a given temperature is from at least one of the first and second modulation current sources whose current output is relatively higher at that temperature.

9. A modulation driver according to claim 8, wherein output modulation current at said modulation current output is from said first modulation current source and said second modulation current source at the first temperature range and the second temperature range respectively, the temperatures of said second temperature range being higher than the temperatures of said first temperature range.

* * * * *

UNITED STATES PATENT AND TRADEMARK OFFICE
CERTIFICATE OF CORRECTION

PATENT NO. : 7,639,954 B2 Page 1 of 1
APPLICATION NO. : 11/246116
DATED : December 29, 2009
INVENTOR(S) : Lam et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 862 days.

Signed and Sealed this

Ninth Day of November, 2010

David J. Kappos
*Director of the United States Patent and Trademark Office*